United States Patent
Joko et al.

(10) Patent No.: US 10,290,555 B2
(45) Date of Patent: May 14, 2019

(54) SEMICONDUCTOR DEVICE INCLUDING SENSOR AND DRIVING TERMINALS SPACED AWAY FROM THE SEMICONDUCTOR DEVICE CASE WALL

(71) Applicant: Mitsubishi Electric Corporation, Tokyo (JP)

(72) Inventors: Motonobu Joko, Tokyo (JP); Rei Yoneyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/374,634

(22) Filed: Dec. 9, 2016

(65) Prior Publication Data

US 2017/0330810 A1 Nov. 16, 2017

(30) Foreign Application Priority Data

May 16, 2016 (JP) .................. 2016-097953

(51) Int. Cl.
*G01R 31/27* (2006.01)
*H01L 23/053* (2006.01)
(Continued)

(52) U.S. Cl.
CPC .......... *H01L 23/053* (2013.01); *G01R 31/275* (2013.01); *G01R 31/44* (2013.01);
(Continued)

(58) Field of Classification Search
CPC . H01L 23/053; H01L 23/49844; H01L 24/49; H01L 23/49838; G01R 31/275
(Continued)

(56) References Cited

U.S. PATENT DOCUMENTS 6,421,244 B1 7/2002 Shinohara et al.
6,735,065 B2 * 5/2004 Graf .................. H01L 23/34
257/E23.08
(Continued)

FOREIGN PATENT DOCUMENTS

DE 199 14 741 A1 10/2000
DE 10 2007 029 678 A1 7/2008
(Continued)

OTHER PUBLICATIONS

An Office Action issued by the German Patent Office dated Dec. 19, 2018, which corresponds to German Patent Application No. 10 2017 207 382.9 and is related to U.S. Appl. No. 15/374,634; with English language translation.
An Office Action; "Notification of Reasons for Refusal," issued by the Japanese Patent Office dated Feb. 12, 2019, which corresponds to Japanese Patent Application No. 2016-097953 and is related to U.S. Appl. No. 15/374,634; with English language translation.

*Primary Examiner* — Robert T Huber
(74) *Attorney, Agent, or Firm* — Studebaker & Brackett PC

(57) ABSTRACT

A semiconductor device comprises a power device, a sensor which measures a physical state of the power device to transmit a signal according to the physical state, and a main electrode terminal through which a main current of the power device flows. The semiconductor device further comprises a sensor signal terminal connected to the sensor for receiving a signal from the sensor, a driving terminal which receives driving power for driving the power device, and an open bottomed case which houses the power device, the sensor, the main electrode terminal, the sensor signal terminal and the driving terminal. The first and second terminals electrically conduct with each other to form a double structure. Also, the sensor signal terminal and the driving terminal each have a first terminal and a second terminal which are not embedded within the case.

7 Claims, 18 Drawing Sheets

(51) Int. Cl.
*H01L 23/498* (2006.01)
*H01L 23/18* (2006.01)
*H01L 23/29* (2006.01)
*G01R 31/44* (2006.01)
*H01L 23/00* (2006.01)
*H01L 23/24* (2006.01)
*H01L 23/373* (2006.01)

(52) U.S. Cl.
CPC ............ *H01L 23/18* (2013.01); *H01L 23/293* (2013.01); *H01L 23/49838* (2013.01); *H01L 23/49844* (2013.01); *H01L 23/24* (2013.01); *H01L 23/3735* (2013.01); *H01L 24/29* (2013.01); *H01L 24/32* (2013.01); *H01L 24/48* (2013.01); *H01L 24/49* (2013.01); *H01L 24/73* (2013.01); *H01L 2224/29101* (2013.01); *H01L 2224/32225* (2013.01); *H01L 2224/48091* (2013.01); *H01L 2224/48227* (2013.01); *H01L 2224/4911* (2013.01); *H01L 2224/73265* (2013.01); *H01L 2924/00014* (2013.01); *H01L 2924/13055* (2013.01); *H01L 2924/13091* (2013.01); *H01L 2924/181* (2013.01); *H01L 2924/19107* (2013.01)

(58) Field of Classification Search
USPC ............................... 257/48, 690, 693, E23.01
See application file for complete search history.

(56) References Cited

U.S. PATENT DOCUMENTS

| | | |
|---|---|---|
| 2001/0038143 A1* | 11/2001 | Sonobe .................... H01L 24/49 257/690 |
| 2008/0158830 A1 | 7/2008 | Tominaga et al. |
| 2009/0096081 A1 | 4/2009 | Soyano |
| 2011/0273861 A1 | 11/2011 | Matsumoto et al. |
| 2012/0025393 A1 | 2/2012 | Kirsch et al. |
| 2014/0167242 A1* | 6/2014 | Kim ...................... H01L 23/053 257/690 |
| 2017/0063071 A1 | 3/2017 | Yoneyama et al. |

FOREIGN PATENT DOCUMENTS

| | | |
|---|---|---|
| DE | 10 2016 215 889 A1 | 3/2017 |
| JP | 06-303778 A | 10/1994 |
| JP | H07-153907 A | 6/1995 |
| JP | H11-016937 A | 1/1999 |
| JP | 2001-189416 A | 7/2001 |
| JP | 2004-022705 A | 1/2004 |
| JP | 2009-099645 A | 5/2009 |
| JP | 2011-238691 A | 11/2011 |
| JP | 2015-220295 A | 12/2015 |

\* cited by examiner

F I G. 5
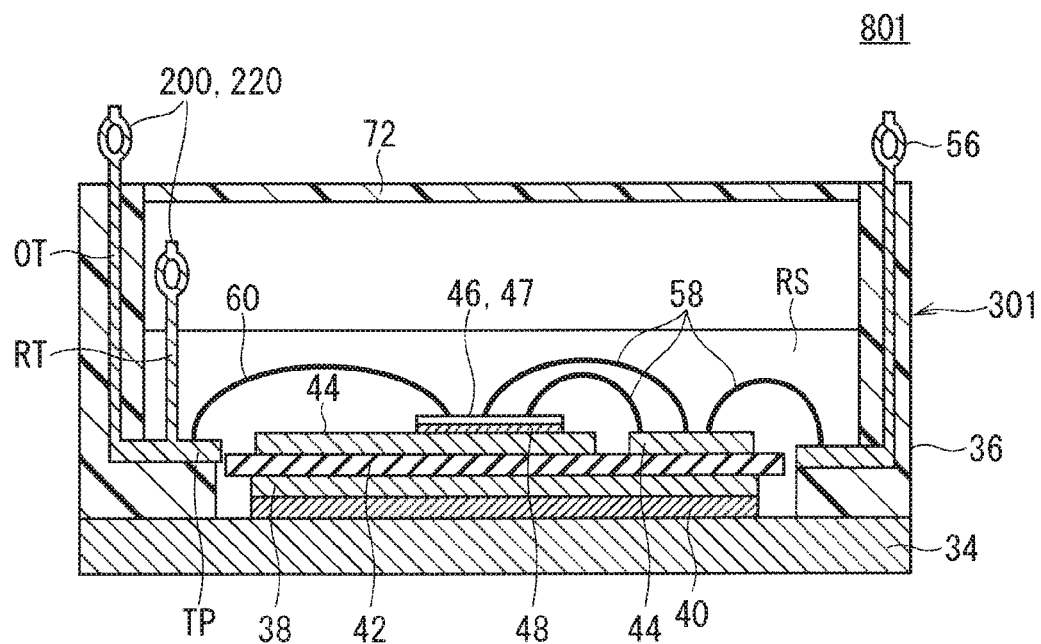

F I G. 1 2
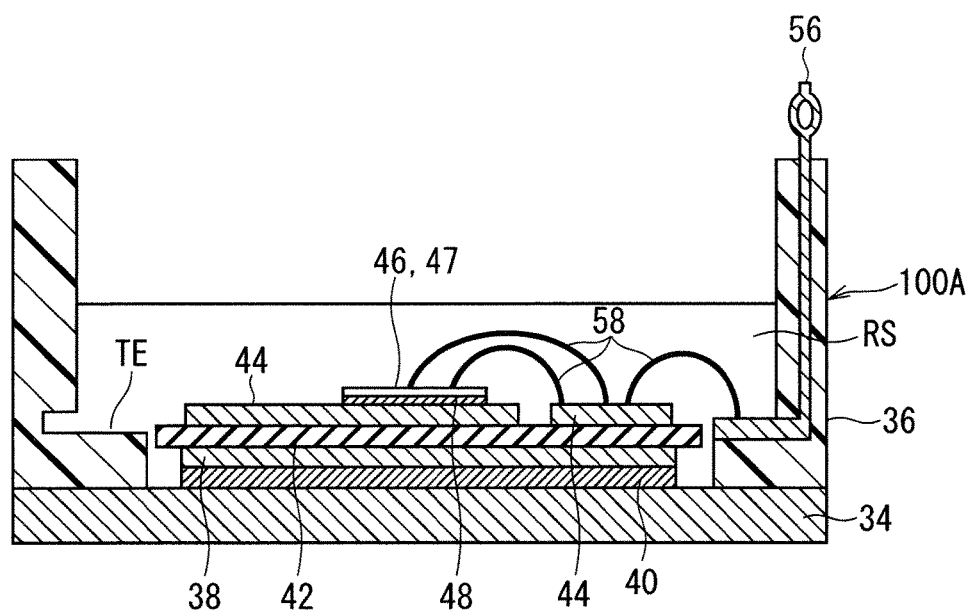

FIG. 24
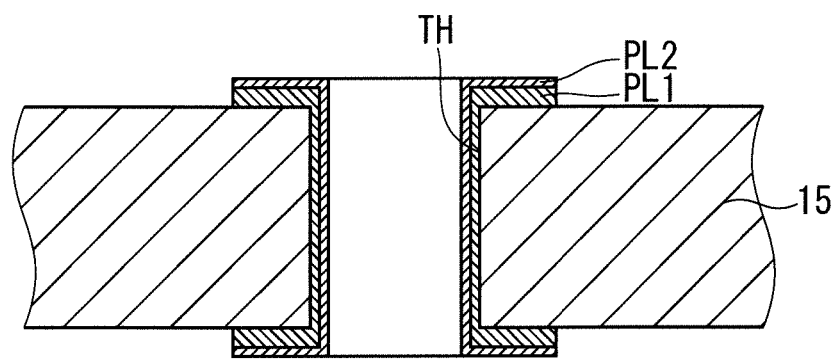
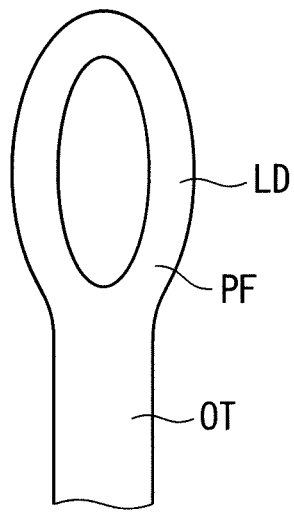

SEMICONDUCTOR DEVICE INCLUDING SENSOR AND DRIVING TERMINALS SPACED AWAY FROM THE SEMICONDUCTOR DEVICE CASE WALL

BACKGROUND OF THE INVENTION

Field of the Invention

The present invention relates to a semiconductor device, and particularly, to a power semiconductor device.

Description of the Background Art

In general, an intelligent power module (IPM) is mounted with a power device such as an insulated gate bipolar transistor (IGBT), a metal-oxide-semiconductor field-effect transistor (MOSFET), a free wheeling diode (FWD) or the like, as well as having a function of controlling drive of a power device. Further, an IPM has various sensors which detect temperature, a current value or the like of a power device and transmit these pieces of information as signals, and has a function of protecting the power device from overheat, overcurrent or the like by using a signal transmitted from each sensor. An IPM thus provided with a function of controlling drive of a power device and a function of protecting the device is packaged and is used for an inverse conversion unit or the like of an inverter device as disclosed in, for example, Japanese Patent Application Laid-Open No. 6-303778 (Patent Document 1).

As disclosed in Patent Document 1, in a conventional IPM, a power device, a sensor unit, a control circuit for drive of a power device and a control circuit for protection operation are housed in a package. Therefore, at the time of changing a specification for control of drive or protection operation, not only design change of the IPM as a whole but also when the IPM is configured as an IGBT module or a MOS transistor module other than an IPM, drastic design change thereof is required to cause a problem of an increase in manufacturing cost.

SUMMARY OF THE INVENTION

An object is to provide a semiconductor device enabling a kind of module to be changed with ease.

A semiconductor device according to the present invention includes a power device, a sensor which measures a physical state of the power device to transmit a signal according to the physical state, a main electrode terminal through which a main current of the power device flows, a sensor signal terminal which is connected to the sensor to receive a signal from the sensor, a driving terminal which receives driving power for driving the power device, and an open bottomed case which houses the power device, the sensor, the main electrode terminal, the sensor signal terminal and the driving terminal, in which the sensor signal terminal and the driving terminal each have a first terminal and a second terminal provided away from an inner side wall surface of the case, the first and second terminals electrically conducting to each other to form a double structure.

Since the first and second terminals electrically conduct to each other to form a double structure, at the time of changing a kind of module, the semiconductor device according to the present invention only needs to use either one of the first and second terminals according to the kind of module, so that parts can be used in common to enable reduction in manufacturing cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a sectional view showing a core block used in common among different modules;

FIG. 12 is a sectional view showing a configuration of a core block of a second preferred embodiment according to the present invention;

FIG. 24 is a view showing a configuration of a press-fit terminal.

DESCRIPTION OF THE PREFERRED EMBODIMENTS

<Introduction>

Figure 1:
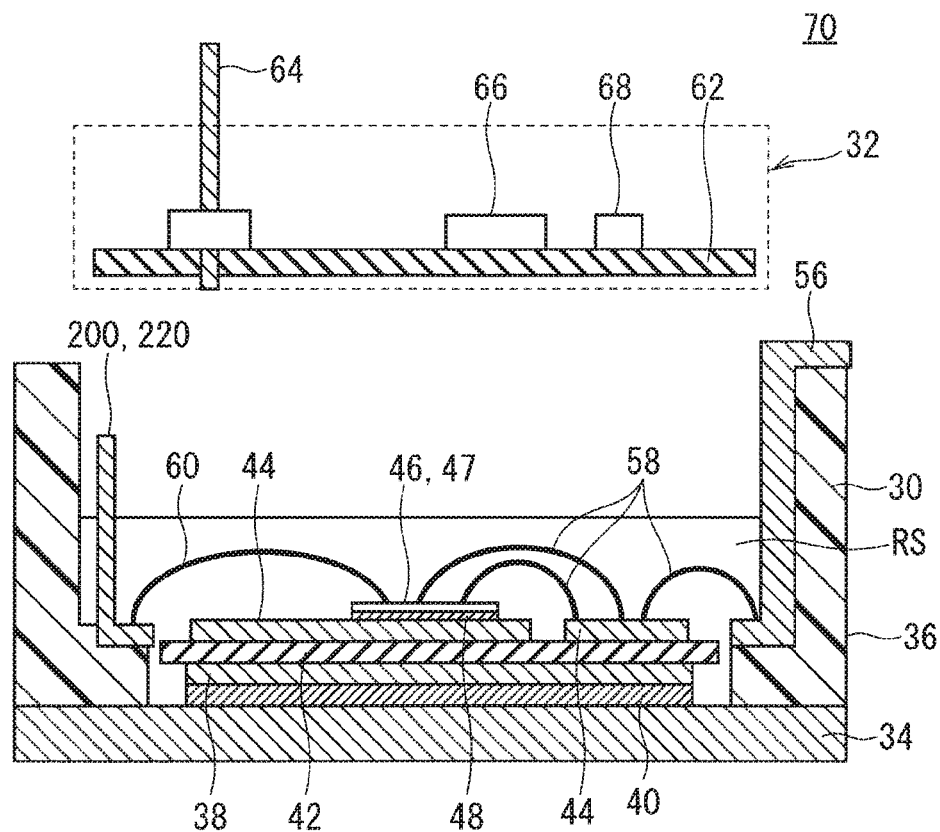
FIG. 1 is an exploded view showing a configuration of an IPM for explaining a presupposed technique of the present invention.

Prior to description of preferred embodiments, a presupposed technique of the present invention will be described. FIG. 1 is an exploded view showing a configuration of an IPM 70 as a presupposed technique of the present invention and is a sectional view schematically showing a configuration of a core block 30 and a control substrate 32. Core block is a generic name of a module configured with semiconductor devices including a power device, a case accommodating the semiconductor device, and the like.

As shown in FIG. 1, in the core block 30, a case 36 formed of an insulating material such as resin is arranged on a base plate 34 made of metal or the like. Inside the case 36, a wiring pattern 38 is bonded on the base plate 34 via, for example, a solder 40. On an upper surface of the wiring pattern 38, an insulating substrate 42 is arranged. A wiring pattern 44 is arranged on an upper surface of the insulating substrate 42, and a power device 46 and a sensor 47 are bonded on an upper surface of the wiring pattern 44 by a solder 48. The sensor 47 measures such physical states of the power device as a signal according to a temperature of the power device and a signal according to a current flowing in the power device 46 and transmits a signal according to a physical state. The wiring patterns 38 and 44 are formed by directly bonding a copper pattern on the insulating substrate 42 formed of alumina ceramics or the like by, for example, a direct copper bond (DCB) method.

Inside the case 36, a sensor signal terminal 200 and a driving terminal 220, and a main electrode terminal 56 are arranged outside the insulating substrate 42. Between the sensor signal terminal 200, the driving terminal 220 and the main electrode terminal 56, and the insulating substrate 42, a fixed space is provided. Here, although a plurality of the sensor signal terminals 200, the driving terminals 220 and the main electrode terminals 56 are provided, the respective terminals are each illustrated as one terminal in FIG. 1 because of overlapping.

The sensor signal terminal 200 is connected to the sensor 47 to receive a signal from the sensor 47. The driving terminal 220 externally receives driving power for driving the power device 46 and supplies the same to the power device 46. Additionally, the main electrode terminal 56 is a terminal through which a main current of the power device 46 flows, and the power device 46 and the main electrode terminal 56 are connected by a bonding wire for power wiring 58. Additionally, the power device 46 is connected to the sensor signal terminal 200 and the driving terminal 220 by a bonding wire for signal wiring 60.

The control substrate 32 includes a printed board 62 on which a circuit pattern not shown, and an integrated circuit 66 and a control circuit 68 connected to each other by the circuit pattern are provided to control drive of the power device 46 and to control protection operation of the power device 46 in response to a signal output by the sensor 47. Additionally, on the printed board 62, an external input/output terminal 64 is provided.

The control substrate 32 is inserted into the case 36 from an opening portion of the case 36, and the sensor signal terminal 200 and the driving terminal 220 are inserted into a through hole (not shown) provided in the printed board 62 and then bonded, thereby connecting the core block 30 and the control substrate 32 to configure the IPM 70. As a method of bonding the sensor signal terminal 200 and the driving terminal 220 with the control substrate 32, soldering, connection by a connector, ultrasonic bonding and welding can be used.

Figure 2:
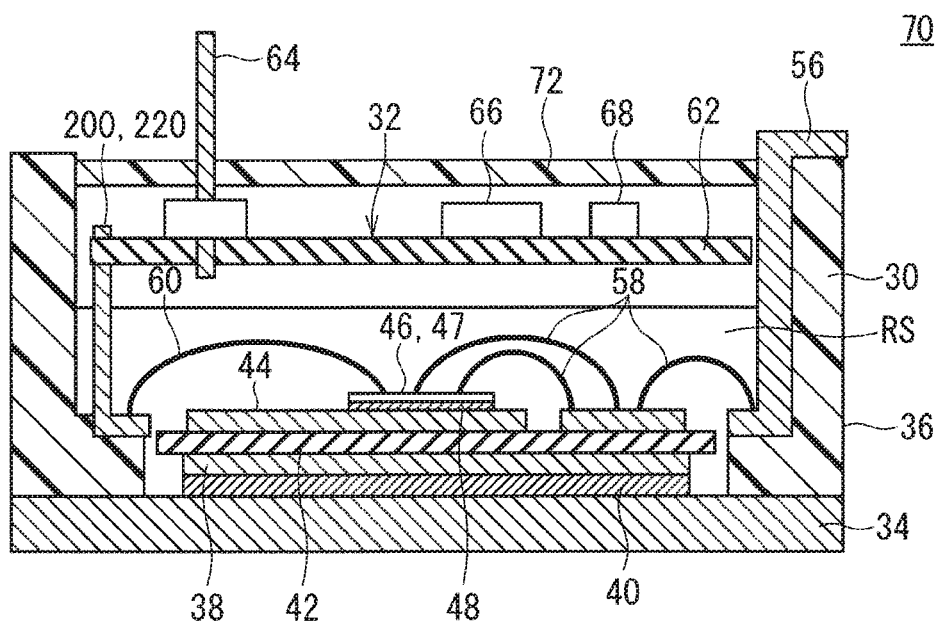
FIG. 2 is a sectional view showing a configuration of an IPM for explaining the presupposed technique of the present invention.

Thereafter, feeding a resin material from the opening portion of the case 36 to cover the insulating substrate 42, the power device 46 mounted on the insulating substrate 42 and the like with a resin RS and covering the opening portion of the case 36 with a lid 72 results in obtaining the IPM 70 as shown in FIG. 2. The lid 72 is provided with a through hole (not shown) though which a front end portion of the external input/output terminal 64 on the control substrate 32 is inserted, so that the front end portion of the external input/output terminal 64 externally protrudes via the through hole.

Figure 3:
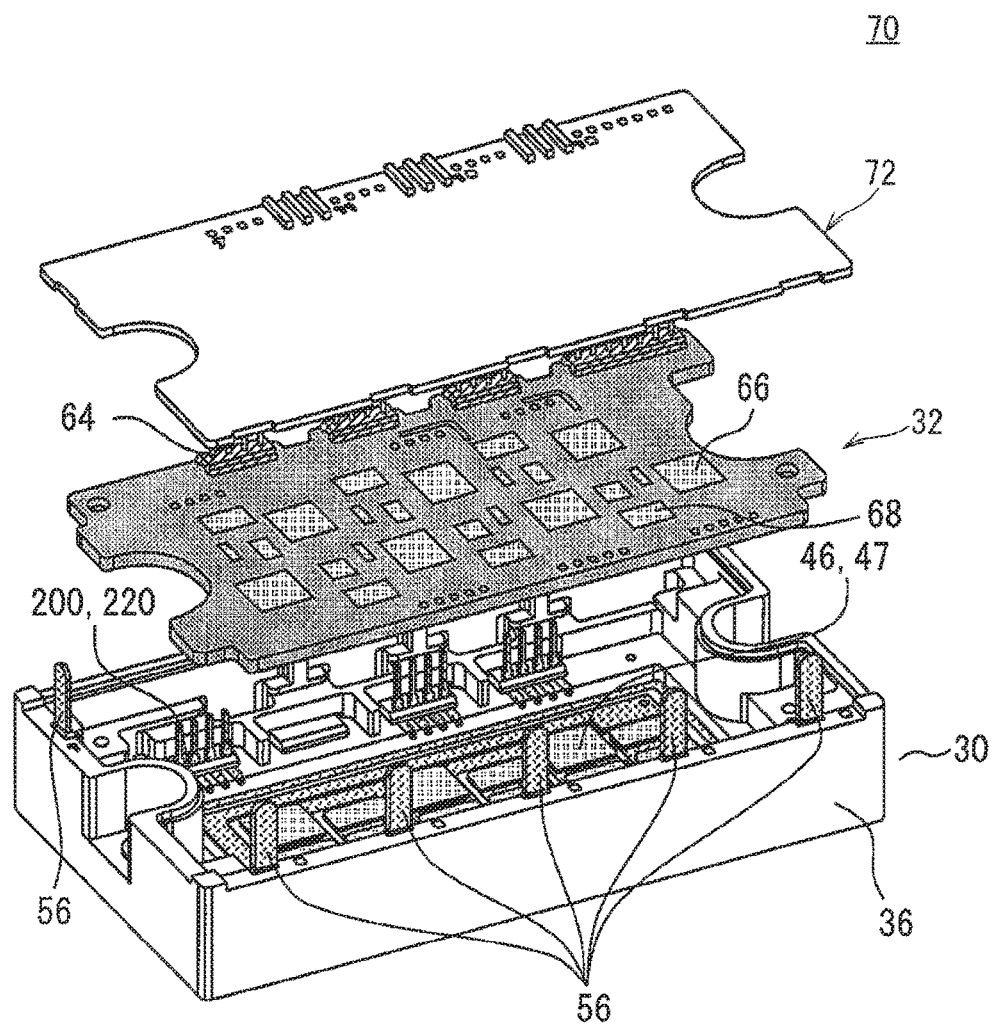
FIG. 3 is an exploded perspective view showing a more specific configuration of the IPM for explaining the presupposed technique of the present invention.

FIG. 3 is an exploded perspective view showing one example of a more specific configuration of the IPM 70 shown in FIG. 2. As shown in FIG. 3, at the top of the core block 30, the control substrate 32 is arranged, and the core block 30 and the control substrate 32 are connected via the sensor signal terminal 200 and the driving terminal 220. Further, at the top of the control substrate 32, the lid 72 is arranged. The main electrode terminal 56 is embedded in a wall surface of the case 36 and has a front end portion externally protruding from an end surface of the wall surface of the case 36.

As described in the foregoing, in the IPM 70, the core block 30 and the control substrate 32 are separately configured, and the control substrate 32 can be independently designed. Therefore, at the time of changing a specification of driving and protection operation, change of only the control substrate 32 is required, which makes a specification change easier as compared with a case where design change of the entire IPM is made at the time of changing a specification. Additionally, separate provision of the control substrate 32 enables standardization of the core block 30 to enable reduction in a development period.

Figure 4:
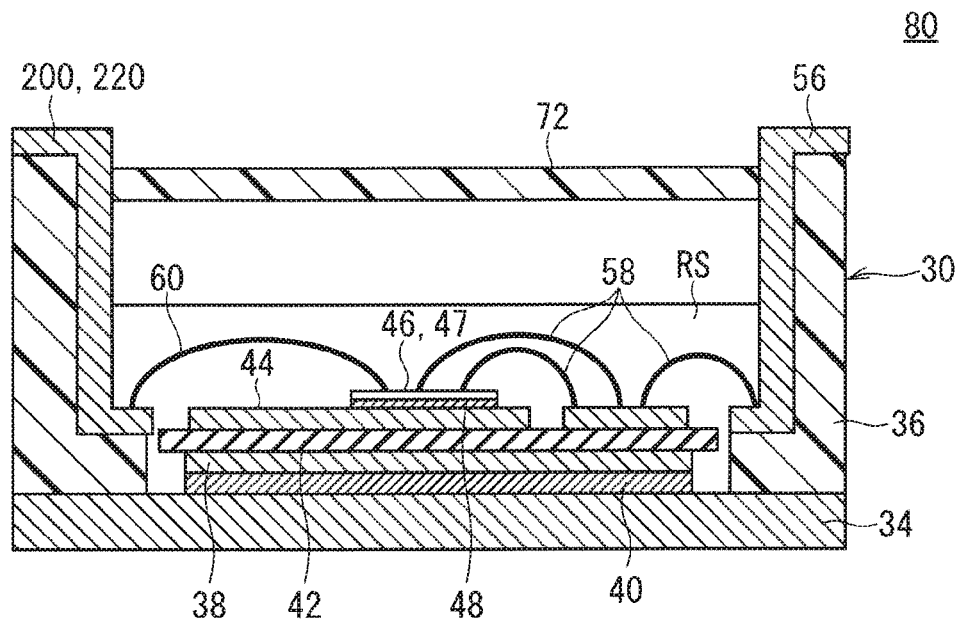
FIG. 4 is a sectional view showing a configuration of an IGBT module for explaining the presupposed technique of the present invention.

Additionally, while the configuration of the IPM 70 has been described in the foregoing, the core block 30 can be used also as a simple IGBT module or MOS transistor module without having the control substrate 32. FIG. 4 is a sectional view showing an IGBT module 80 configured using the core block 30. In FIG. 4, the same components as those of the IPM 70 described with reference to FIG. 2 are given the same reference codes to omit description of an overlapping part.

As shown in FIG. 4, in the IGBT module 80, the sensor signal terminal 200 and the driving terminal 220 are each embedded in the wall surface of the case 36 and have a front end portion externally protruding from the end surface of the wall surface of the case 36 similarly to the main electrode terminal 56.

Thus, although the IGBT module and the MOS transistor module can be configured using the core block 30, the IPM 70 and the IGBT module 80 are not allowed to use the core block 30 in common.

The inventors have therefore developed a core block 301 as shown in FIG. 5 as a configuration which allows an IPM, an IGBT module and a MOS transistor module to use a core block in common.

FIG. 5 is a sectional view showing an IGBT module 801 configured using the core block 301. In FIG. 5, the same components as those of the IPM 70 described with reference to FIG. 2 are given the same reference codes to omit description of an overlapping part.

As shown in FIG. 5, in the IGBT module 801, both of the sensor signal terminal 200 and the driving terminal 220 have a double structure which has an external connection terminal OT embedded in a side wall of the case 36 and having a front end portion externally protruding from the end surface of the wall surface of the case 36 and a relay terminal RT not embedded in the side wall of the case 36 and having a front end portion not externally protruding from the case 36. Specifically, the external connection terminal OT and the relay terminal RT are configured to have a common terminal pad TP to be electrically conducted with each other. Accordingly, when the IGBT module 801 is configured using the core block 301, a driving power signal and a signal can be input/output to/from the outside using the external connection terminal OT. By contrast, since the relay terminal RT is housed in the case 36, covering the opening portion of the case 36 with the lid 72 prevents the relay terminal RT from coming into contact with the outside.

While FIG. 5 shows a case where the main electrode terminal 56 embedded in the side wall of the case 36, and the external connection terminal OT and the relay terminal RT are configured to be a press-fit terminal, the terminals may be configured to be a solder terminal.

Figure 6:
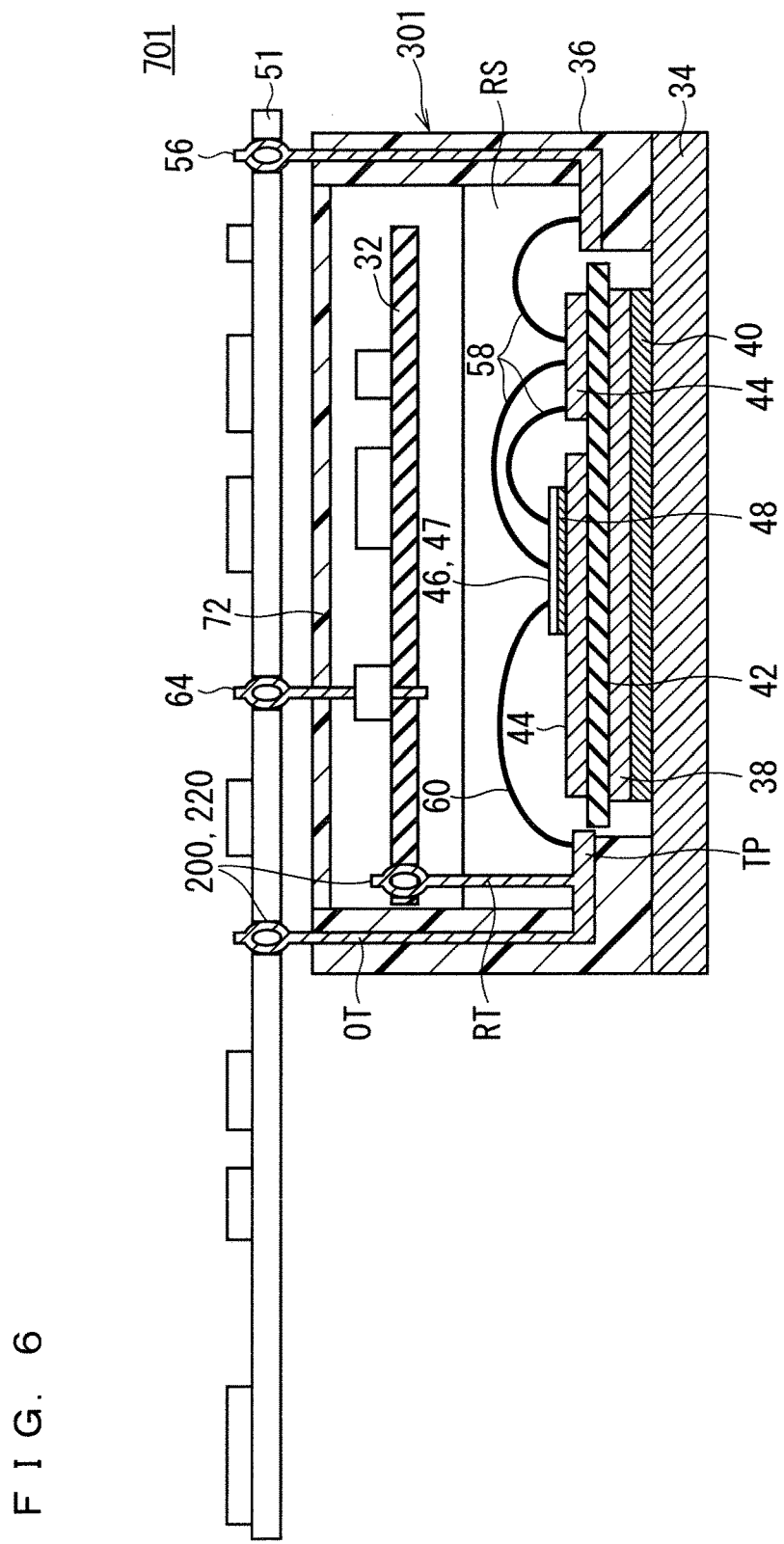
FIG. 6 is a sectional view showing an IPM configured using the commonly used core block.

FIG. 6 is a sectional view showing an IPM 701 configured using the core block 301. In FIG. 6, the same components as those of the IPM 70 described with reference to FIG. 2 are given the same reference codes to omit description of an overlapping part.

As shown in FIG. 6, in the IPM 701, the relay terminals RT of the sensor signal terminal 200 and the driving terminal 220 are inserted into through holes (not shown) provided in the printed board 62 and then bonded, thereby connecting the core block 301 and the control substrate 32 to have the front end portion of the external input/output terminal 64 provided on the control substrate 32 so as to externally protrude via a through hole (not shown) provided in the lid 72.

Here, on the top of the IPM 701, a user printed circuit board (PCB) 51 is mounted, and the front end portion of the external input/output terminal 64 and a front end portion of the main electrode terminal 56 are inserted into through holes (not shown) of the user PCB 51 and bonded, thereby connecting the IPM 701 and the user PCB 51.

Although the control substrate 32 of the IPM 701 has a control circuit for driving a power device and a control circuit for protection operation to control driving of the power device and control protection operation of the power device according to a signal output by the sensor 47, since such electric parts as a signal circuit (photo-coupler etc.), a power source circuit and a memory control unit (MCU) for operating the IPM are not mounted on the control substrate 32, a user of the IPM 701 is to design these circuits according a desired specification and mount the same on the user PCB 51.

The problem here is presence of the external connection terminal OT whose front end portion externally protrudes from the end surface of the wall surface of the case 36. Since the external connection terminal OT is electrically conducted with the relay terminal RT, it is not desirable that the front end portion thereof is in contact with an electric part on the user PCB 51. Therefore, the external connection terminal OT is also configured to have the front end portion inserted into the through hole (not shown) provided in the user PCB 51 and then bonded. As a matter of course, the through hole into which the front end portion of the external connection terminal OT is inserted is in contact neither with each other nor with an electric part on the user PCB 51.

Figure 7:
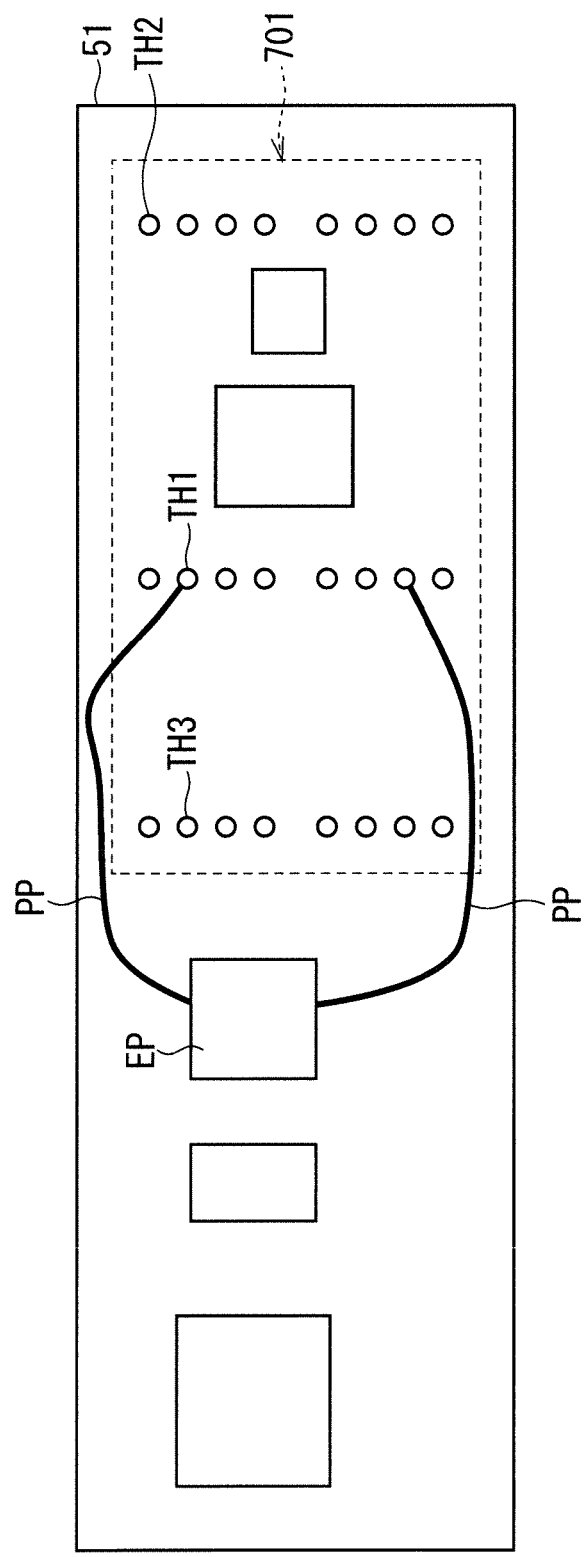
FIG. 7 is a plan view of a user PCB seen from above.

FIG. 7 shows a plan view of the user PCB 51 seen from above. As shown in FIG. 7, the user PCB 51 is provided with a through hole TH1 provided corresponding to an arrangement position of the external input/output terminal 64, a through hole TH2 provided corresponding to an arrangement position of the main electrode terminal 56, and a through hole TH3 provided corresponding to an arrangement position of the external connection terminal OT. The through holes TH1 to TH3 each include a plurality of holes provided in line.

In such a configuration, for electrically connecting an electric part provided at an outer side (the side not at the top of the IPM 701) of the arrangement of the through holes TH3 with, for example, the through hole TH1, a wiring pattern PP detouring the arrangement of the through holes TH3 should be provided, so that it is highly probable that flexibility in design of the user PCB 51 such as insulation design, pattern design or the like is deteriorated. The inventors therefore have developed a core block further easier to handle as the present invention. In the following, preferred embodiments according to the present invention will be described.

First Preferred Embodiment

Figure 8:
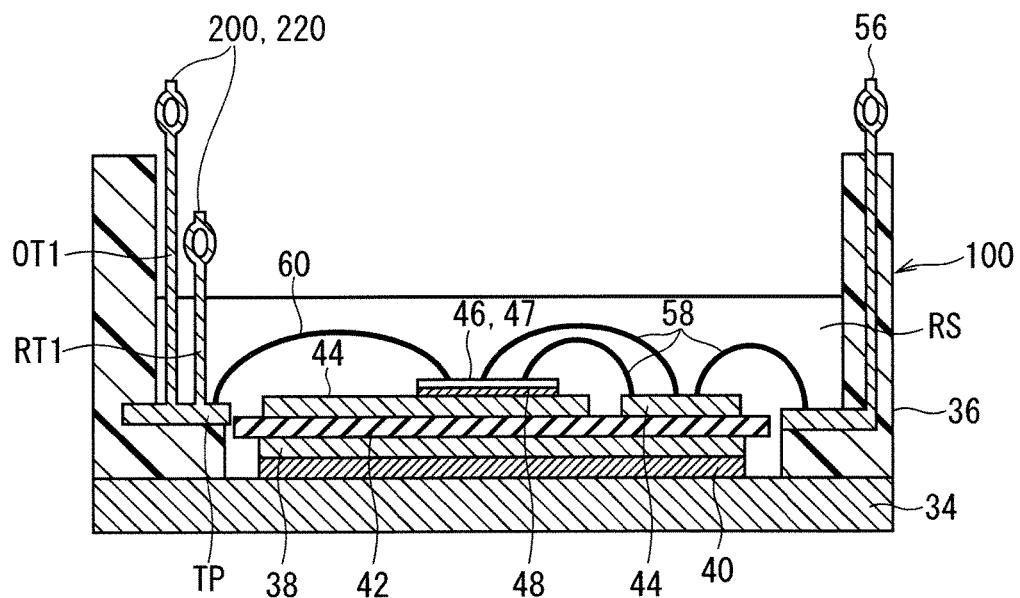
FIG. 8 is a sectional view showing a configuration of a core block of a first preferred embodiment according to the present invention.

FIG. 8 is a sectional view showing a configuration of a core block 100 of a first preferred embodiment according to the present invention. In FIG. 8, the same components as those of the IPM 70 described with reference to FIG. 2 are given the same reference codes to omit description of an overlapping part.

As show in FIG. 8, in the core block 100, both of a sensor signal terminal 200 and a driving terminal 220 have a double structure which has an external connection terminal OT1 (first terminal) provided away from an inner side wall surface of a case 36 and having a front end portion externally protruding from the case 36, and a relay terminal RT1 (second terminal) having a front end portion not externally protruding from the case 36. Specifically, the external connection terminal OT1 and the relay terminal RT1 are configured to have a common terminal pad TP and to be electrically conducted with each other. Accordingly, when an IGBT module or a MOS transistor module is configured using the core block 100, driving power and a signal can be input/output to/from the outside using the external connection terminal OT1.

Figure 9:
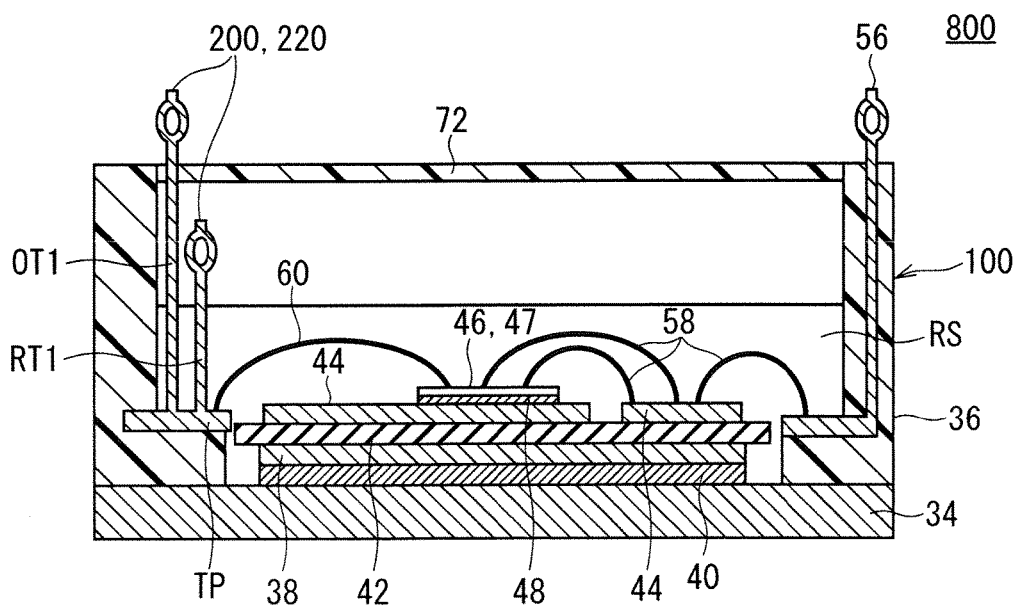
FIG. 9 is a sectional view showing an IGBT module configured using the core block of the first preferred embodiment according to the present invention.

FIG. 9 is a sectional view showing an IGBT module 800 configured using the core block 100. As shown in FIG. 9, in the IGBT module 800, driving power and a signal are input/output to/from the outside using the external connection terminal OT1.

By contrast, since the relay terminal RT1 is housed in the case 36, covering an opening portion of the case 36 with a lid 72 makes it possible to obtain an IGBT module with ease without having the relay terminal RT1 in contact with the outside.

Figure 10:
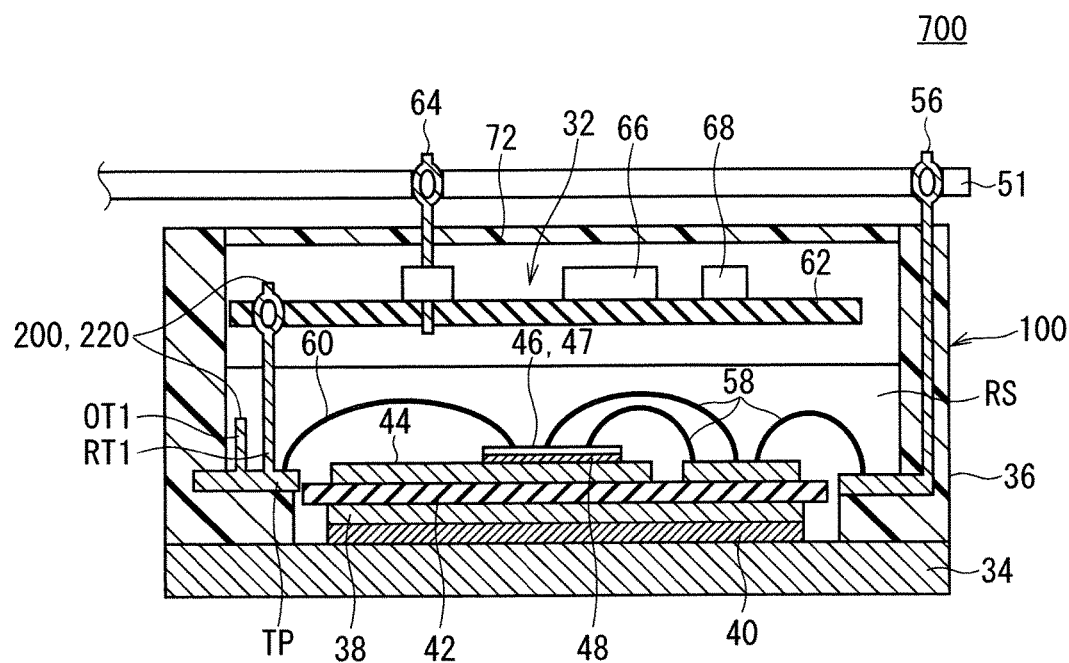
FIG. 10 is a sectional view showing an IPM configured using the core block of the first preferred embodiment according to the present invention.

FIG. 10 is a sectional view showing an IPM 700 configured using the core block 100. In FIG. 10, the same components as those of the IPM 701 described with reference to FIG. 6 are given the same reference codes to omit description of an overlapping part.

As shown in FIG. 10, in the IPM 700, the relay terminals RT1 of the sensor signal terminal 200 and the driving terminal 220 are inserted into through holes (not shown) provided in a printed board 62 and then bonded, thereby connecting the core block 100 and a control substrate 32 to input/output driving power and a signal to/from the control substrate 32. Additionally, a front end portion of the external input/output terminal 64 provided on the control substrate 32 externally protrudes via a through hole (not shown) provided in the lid 72.

By contrast, the external connection terminals OT1 of the sensor signal terminal 200 and the driving terminal 220 are configured to be cut so as to be housed in the case 36 and not to protrude from the case 36. Accordingly, only the front end portion of the external input/output terminal 64 and a front end portion of a main electrode terminal 56 embedded in a side wall of the case 36 protrude from the case 36, so that an IPM can be obtained with ease.

While FIG. 10 shows a case where the main electrode terminal 56 embedded in the side wall of the case 36, and the external connection terminal OT1 and the relay terminal RT1 are configured to be a press-fit terminal, the terminals may be configured to be a solder terminal.

Here, on the top of the IPM 700, a user PCB 50 is mounted, and the front end portion of the external input/output terminal 64 and the front end portion of the main electrode terminal 56 are inserted into through holes (not shown) of the user PCB 50 and then bonded, thereby connecting the IPM 700 and the user PCB 50. However, since the external connection terminals OT1 of the sensor signal terminal 200 and the driving terminal 220 are cut so as to be housed in the case 36, the terminals are not connected to the user PCB 50.

Figure 11:
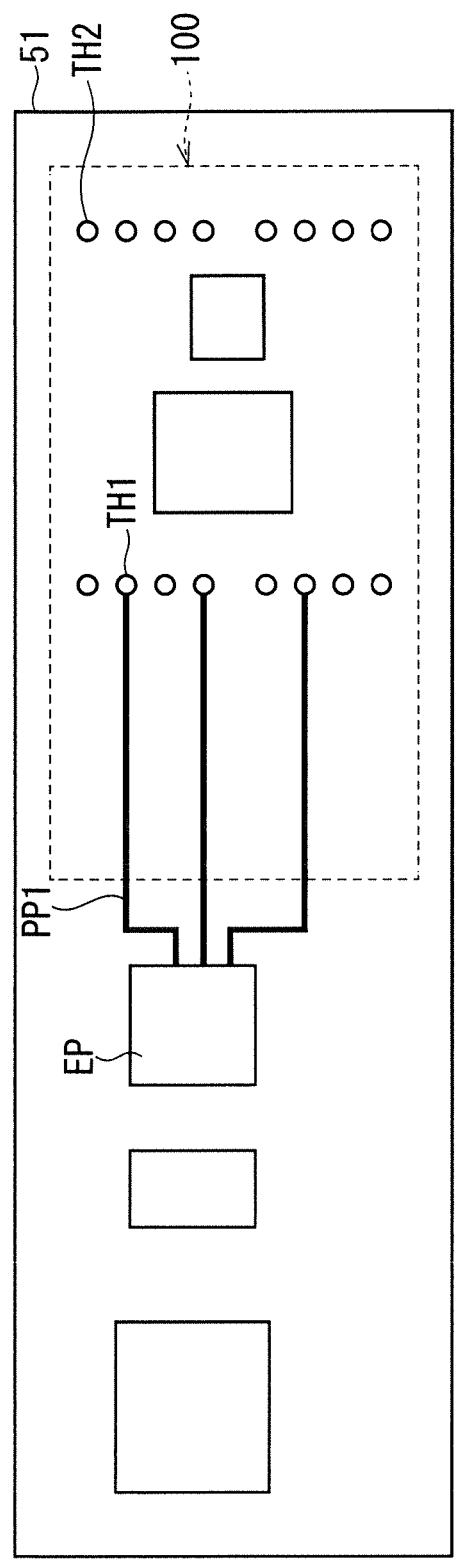
FIG. 11 is a plan view of a user PCB seen from above.

FIG. 11 shows a plan view of a user PCB 51 seen from above. As shown in FIG. 11, the user PCB 51 is provided with a through hole TH1 provided corresponding to an arrangement position of the external input/output terminal 64, and a through hole TH2 provided corresponding to an arrangement position of the main electrode terminal 56. The through holes TH1 and TH2 each include a plurality of holes provided in line.

In such a configuration, for electrically connecting an electric part provided not at the top of the IPM 700 with, for example, the through hole TH1, because no obstacle is present therebetween, a linear wiring pattern PP1 can be provided, so that flexibility in design of the user PCB 50 such as insulation design, pattern design or the like will not be deteriorated.

Thus, since in the core block 100 of the first preferred embodiment according to the present invention, both of the sensor signal terminal 200 and the driving terminal 220 have a double structure which has the external connection terminal OT1 provided away from the inner side wall surface of the case 36 and having the front end portion externally protruding from an end surface of a wall surface of the case 36, and the relay terminal RT1 having the front end portion not externally protruding from the case 36, at the time of configuring the IPM, it is only necessary to cut off the unrequired external connection terminal OT1, so that the core block can be used entirely in common by an IPM, an IGBT module and a MOS transistor module to enable reduction in manufacturing cost. Additionally, standardization of the core block 100 enables reduction in a development period.

Additionally, since the core block 100 and the control substrate 32 are separately configured, the control substrate 32 can be independently designed. Therefore, at the time of changing a specification of driving and protection operation, change of only the control substrate 32 is required, which makes a specification change easier as compared with a case where design change of the entire IPM is made at the time of changing a specification.

Second Preferred Embodiment

FIG. 12 is a sectional view showing a configuration of a core block 100A of a second preferred embodiment according to the present invention. In FIG. 12, the same components as those of the IPM 70 described with reference to FIG. 2 are given the same reference codes to omit description of an overlapping part.

As shown in FIG. 12, in the core block 100A, neither a sensor signal terminal 200 nor a driving terminal 220 is provided, and a case 36 is only provided with a terminal engaging portion TE for attaching the sensor signal terminal 200 and the driving terminal 220. Additionally, a bonding wire for signal wiring for connecting a power device 46 with the sensor signal terminal 200 and the driving terminal 220 is not provided either.

Figure 13:
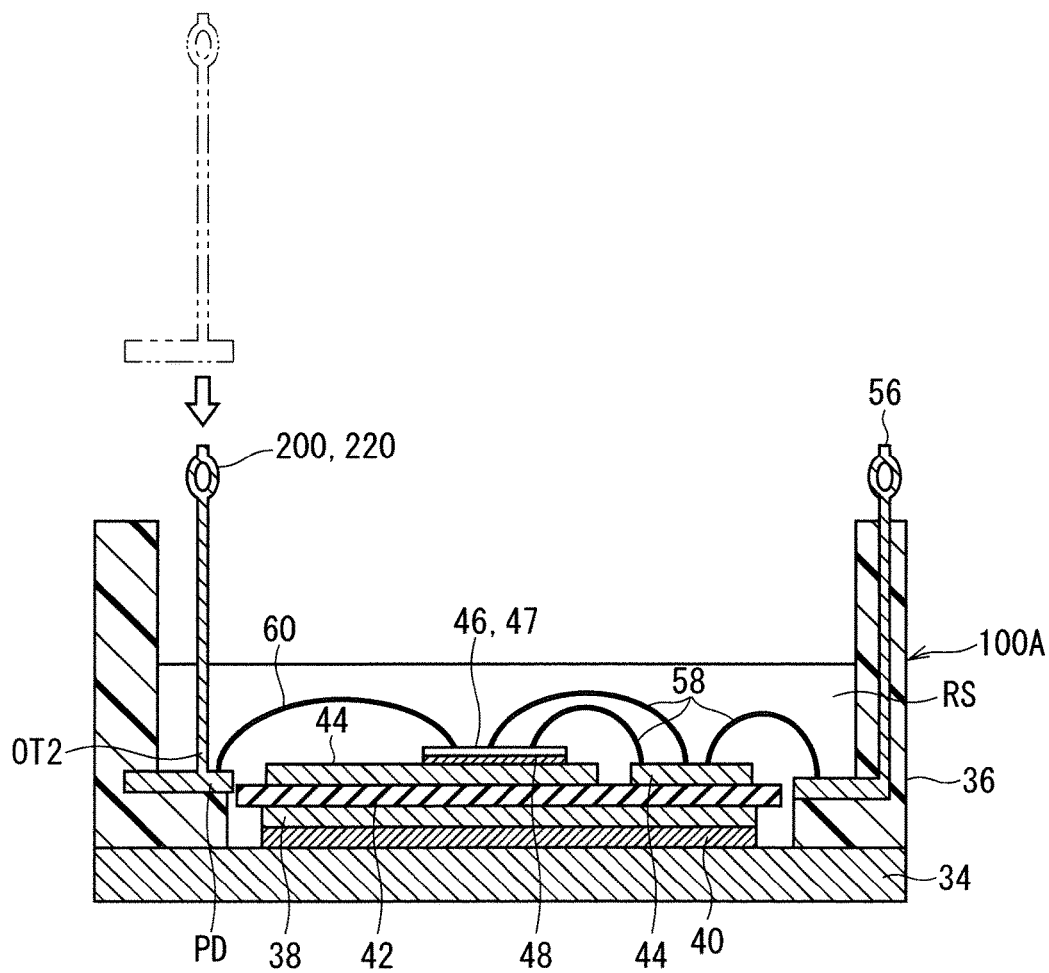
FIG. 13 is a sectional view showing a configuration of a core block of the second preferred embodiment according to the present invention.

Thus, when an IGBT module or a MOS transistor module is configured using the core block 100A, as shown in FIG. 13, attaching an external connection terminal OT2 (first terminal) to the terminal engaging portion TE to use the same as the sensor signal terminal 200 and the driving terminal 220 enables input/output of driving power and a signal to/from the outside.

Specifically, attaching, to the terminal engaging portion TE, the external connection terminal OT2 which has a length that enables a front end portion thereof to externally protrude from an end surface of a wall surface of the case 36, and providing a bonding wire for signal wiring 60 which connects a terminal pad TP and the power device 46 results in electrically connecting the external connection terminal OT2 and the power device 46, thereby making it possible to obtain an IGBT module with ease.

Figure 14:
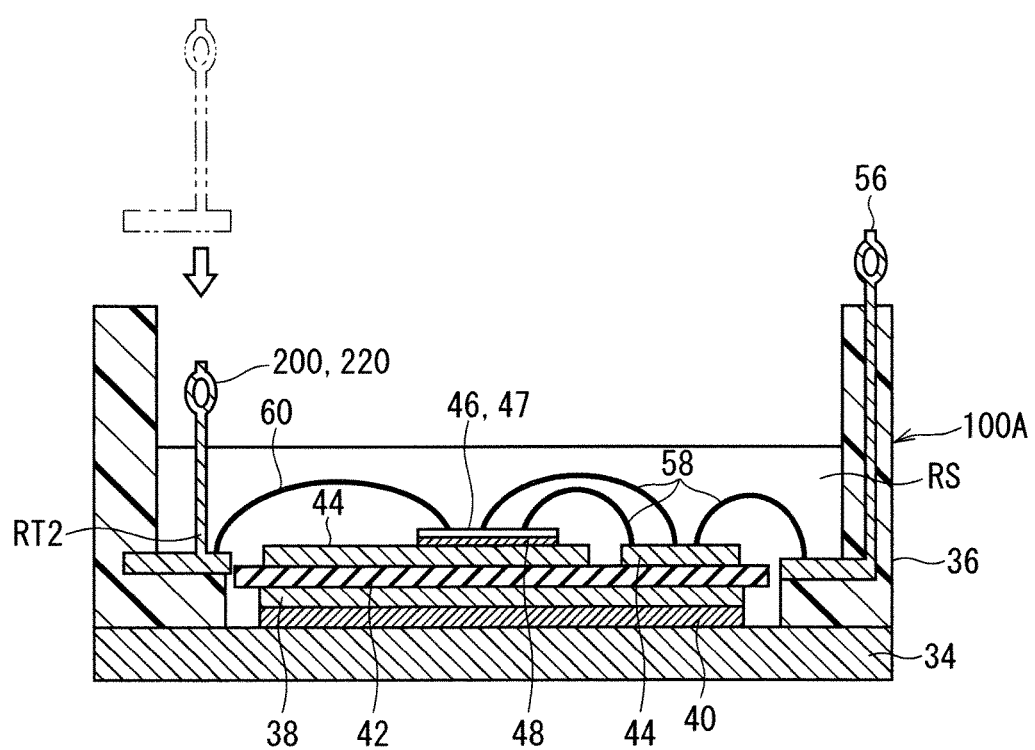
FIG. 14 is a sectional view showing a configuration of a core block of the second preferred embodiment according to the present invention.

Additionally, when an IPM is configured using the core block 100A, as shown in FIG. 14, a relay terminal RT2 (second terminal) is attached to the terminal engaging portion TE to be used as the sensor signal terminal 200 and the driving terminal 220. Then, providing the bonding wire for signal wiring 60 which connects the terminal pad TP and the power device 46 results in electrically connecting the relay terminal RT2 and the power device 46, thereby making it possible to obtain an IPM with ease.

Figure 15:
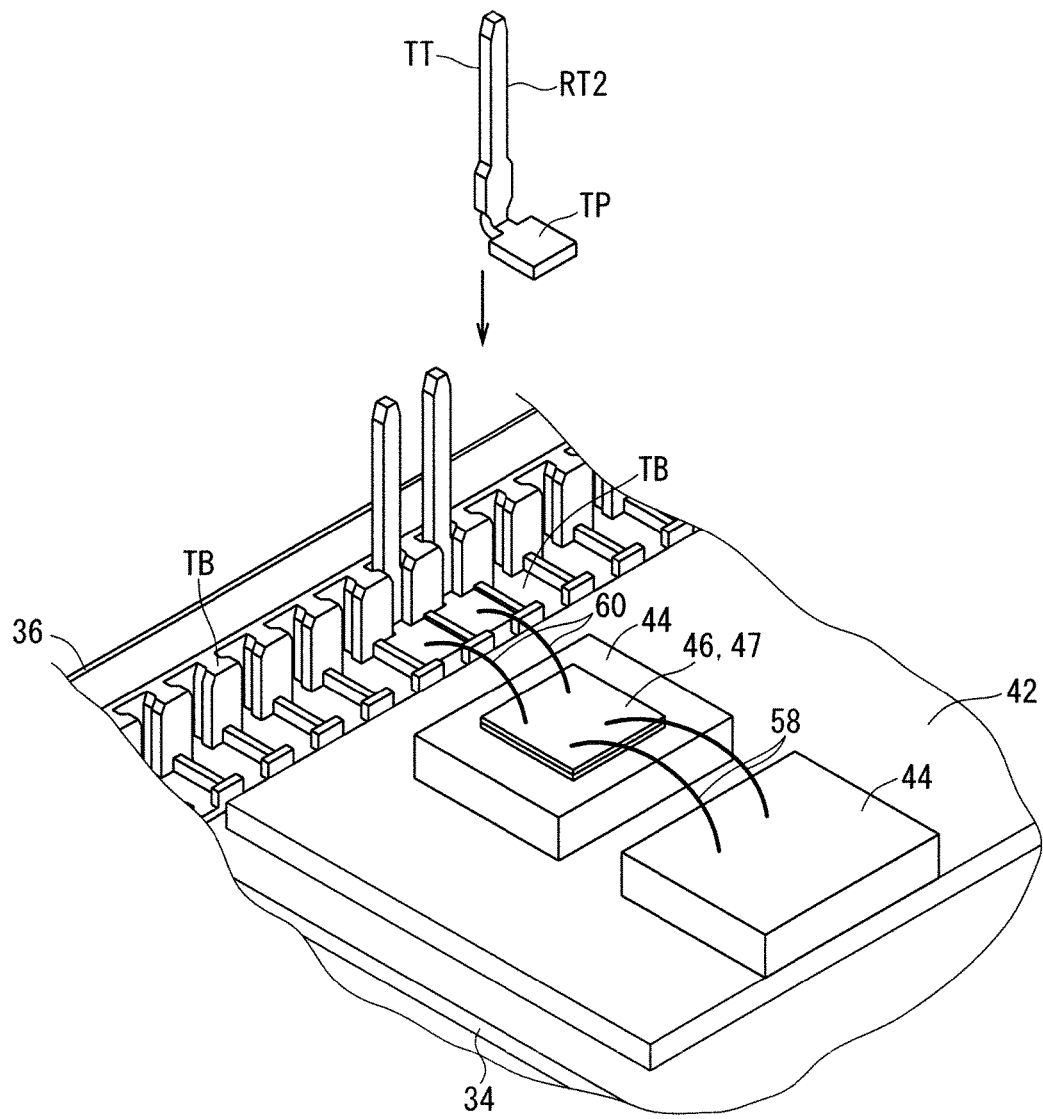
FIG. 15 is a perspective view showing a configuration of a terminal engaging portion and a relay terminal.

Here, FIG. 15 shows one example of a configuration of the terminal engaging portion TE and the relay terminal RT2. As shown in FIG. 15, a plurality of the terminal engaging portions TE are provided in a terminal block TB made of resin and arranged along an extension direction of the wall surface of the case 36. Each of the terminal engaging portions TE is configured with a groove provided in the terminal block TB so as to allow a terminal portion TT and the terminal pad TP of the relay terminal RT2 to insert therein. Inserting the relay terminal RT2 into the groove and thermally welding the same enables the relay terminal RT2 to be fixed to the terminal engaging portion TE. While the relay terminal RT2 in FIG. 15 shows one example of a solder terminal, the terminal may be a press-fit terminal. Additionally, it is apparent that the external connection terminal OT2 can be similarly fixed.

Figure 16:
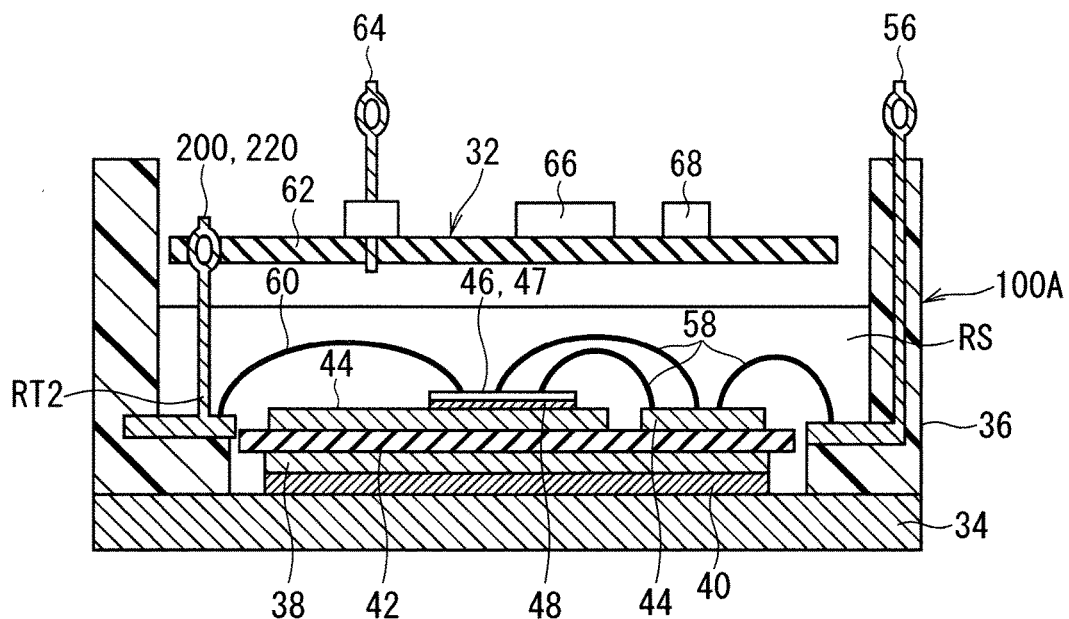
FIG. 16 is a sectional view showing an IPM configured using the core block of the second preferred embodiment according to the present invention.

FIG. 16 shows a configuration in which when an IPM is configured using the core block 100A, the relay terminal RT2 is attached to the terminal engaging portion TE, and the relay terminal RT2 is inserted into a through hole (not shown) provided in a printed board 62 and then bonded, thereby connecting the core block 100A and a control substrate 32. In the IPM, no external connection terminal is required and therefore not provided in FIG. 16.

Thus, in the core block 100A of the second preferred embodiment according to the present invention, since both of the sensor signal terminal 200 and the driving terminal 220 have a structure in which the external connection terminal OT2 and the relay terminal RT2 are attached in conformity with a mode of a module, at the time of configuring the IPM, it is only necessary to attach the relay terminal RT2 but not the external connection terminal OT2, so that the core block can be used entirely in common by an IPM, an IGBT module and a MOS transistor module to enable reduction in manufacturing cost. Additionally, standardization of the core block 100A enables reduction in a development period.

The core block 100A and the control substrate 32 are configured separately and it is therefore apparent that a specification change is made easier.

Third Preferred Embodiment

While the first preferred embodiment and the second preferred embodiment described in the foregoing shows that the IGBT module or the MOS transistor module is configured to input/output driving power and a signal using the external connection terminal, the module can be configured to input/output driving power and a signal using a relay terminal.

Figure 17:
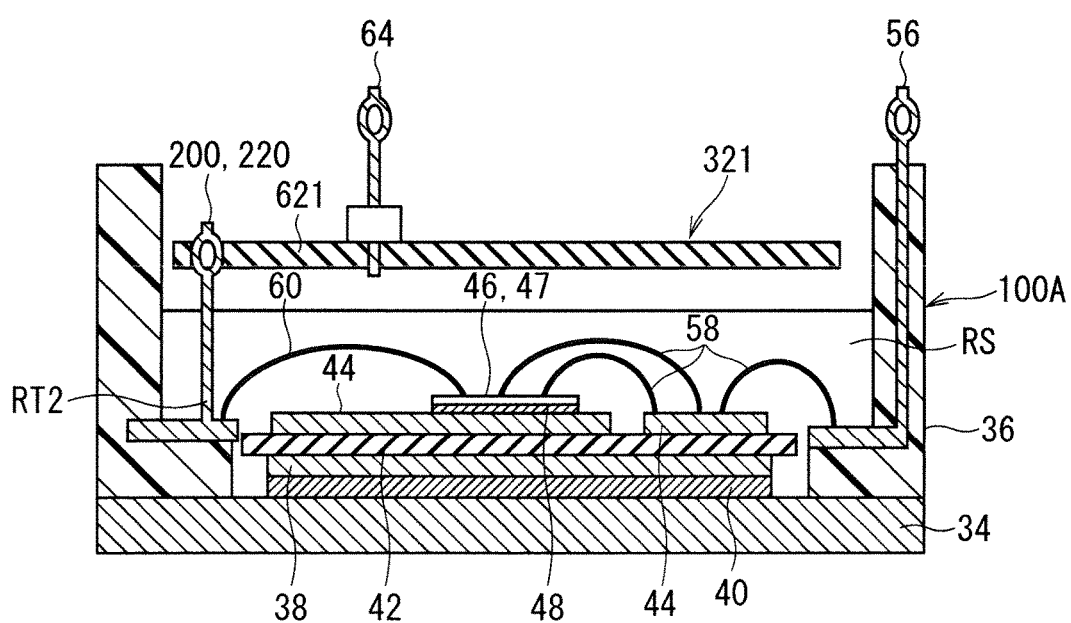
FIG. 17 is a sectional view showing a configuration of an IGBT module of a third preferred embodiment according to the present invention.

FIG. 17 is a sectional view showing a configuration in which driving power and a signal are input/output using a relay terminal RT2 in a case where an IGBT module or a MOS transistor module is configured using a core block 100A.

Specifically, as shown in FIG. 17, the core block 100A is configured such that the relay terminal RT2 is attached to a terminal engaging portion TE, and the relay terminal RT2 is inserted into a through hole (not shown) provided in a printed board 621 configuring an internal wiring substrate 321 and then bonded, thereby connecting the core block 100A and the internal wiring substrate 321. The internal wiring substrate 321 includes the printed board 621 on which an internal wiring pattern not shown is provided. Additionally, on the printed board 621, an external input/output terminal 641 is provided which is electrically connected to the relay terminal RT2 by the internal wiring pattern. Accordingly, a power device 46 is electrically connected to the external input/output terminal 641 via a bonding wire for signal wiring 60, the relay terminal RT2 and the internal wiring pattern, thereby making it possible to input/output driving power and a signal to/from the outside.

The external input/output terminal 641 can be provided at an arbitrary position of the printed board 621 to resultantly increase flexibility in design of the external input/output terminal 641.

Figure 18:
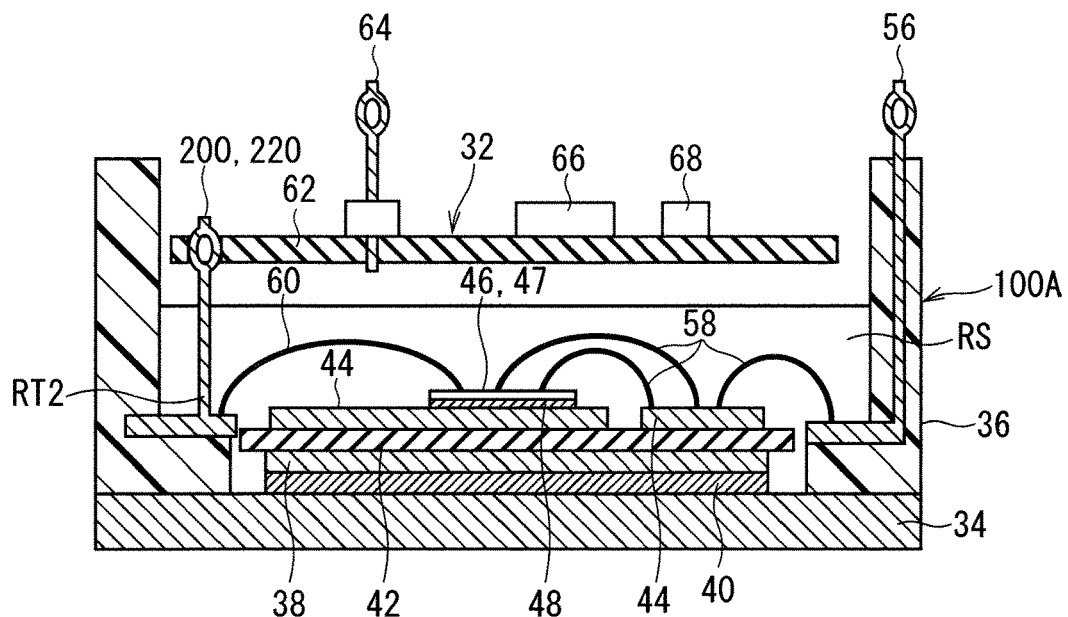
FIG. 18 is a sectional view showing a configuration of an IPM of the third preferred embodiment according to the present invention.

Additionally, FIG. 18 shows a configuration in which in a case where an IPM is configured using the core block 100A, the relay terminal RT2 is attached to the terminal engaging portion TE, and the relay terminal RT2 is inserted into a through hole (not shown) provided in a printed board 62 and then bonded, thereby connecting the core block 100A and a control substrate 32. Since no external connection terminal is required in the IPM, the terminal is not provided in FIG. 18. As a matter of course, a position of the external input/output terminal 64 provided on the printed board 62 can be arbitrarily set, and an increase in flexibility of design of the external input/output terminal 64 leads to an increase in flexibility of design of a user PCB arranged in a further upper part.

While FIG. 17 shows an example where the IGBT module or the MOS transistor module is configured using the core block 100A, the internal wiring substrate 321 is similarly applicable to a case where the IGBT module or the MOS transistor module is configured using the core block 100 of the first preferred embodiment as described with reference to FIG. 8.

<Modification 1>

Figure 19:
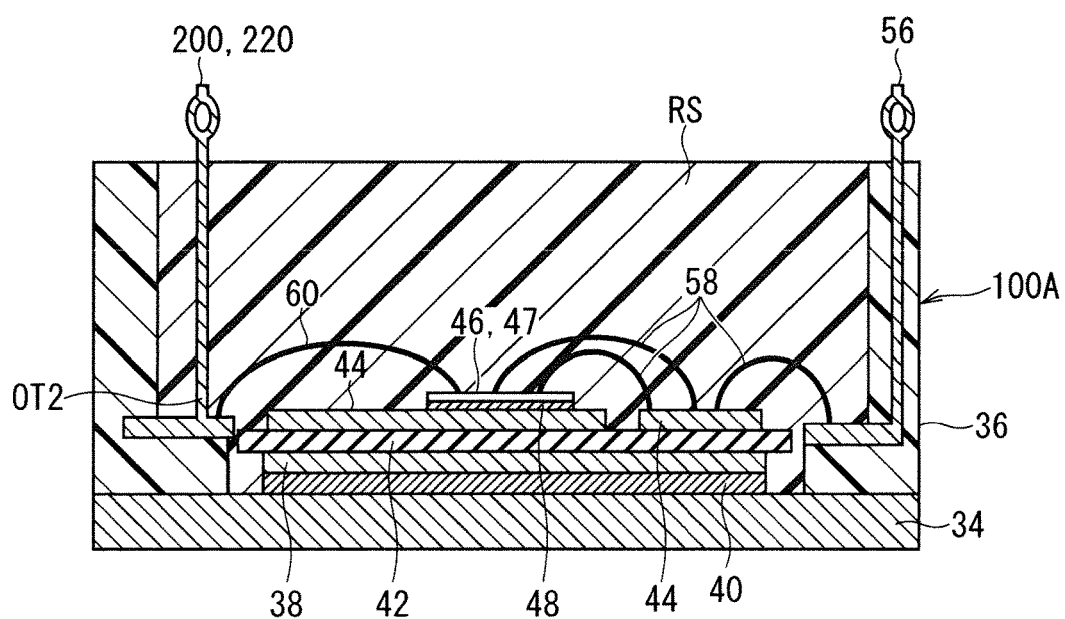
FIG. 19 is a sectional view showing a configuration in which a case is filled with a resin material.

FIG. 19 discloses a configuration in which a case 36 is filled with a resin material to seal an insulating substrate 42, a power device 46 mounted on the insulating substrate 42 and the like with a resin RS in a case where the IGBT module or the MOS transistor module is configured using a core block 100A.

Figure 20:
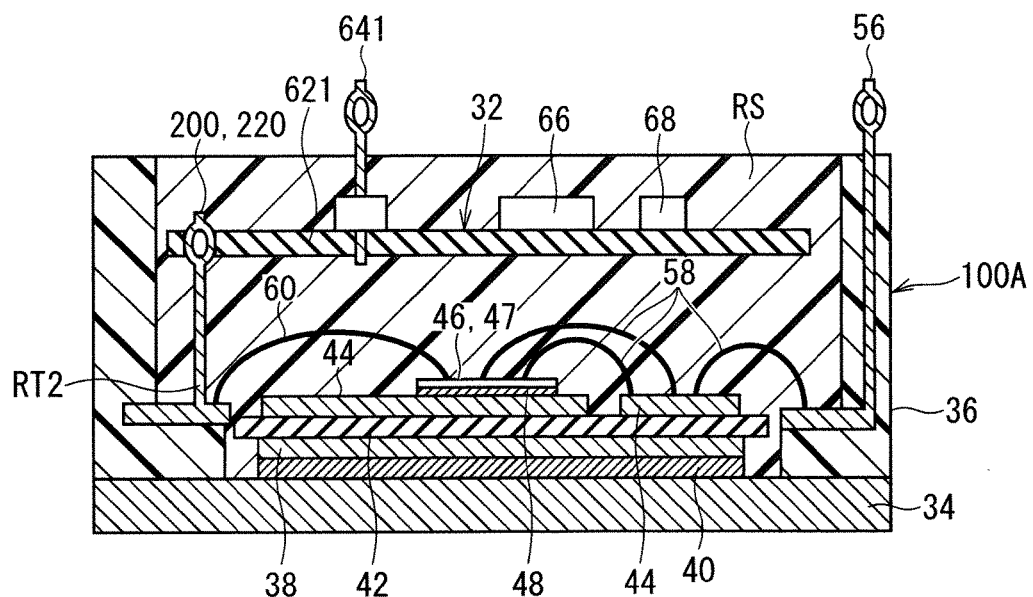
FIG. 20 is a sectional view showing a configuration in which the case is filled with a resin material.

Additionally, FIG. 20 discloses a configuration in which the case 36 is filled with a resin material to seal not only the insulating substrate 42, the power device 46 mounted on the insulating substrate 42 and the like but also a relay terminal RT2 and a control substrate 32 with the resin RS in a case where the IPM is configured using the core block 100A.

Thus, sealing the case 36 with the resin RS obtains a solid with some extent of strength as a result of solidification of the resin RS, thereby enabling the configuration in the case 36 to be protected. In particular, deformation of an external connection terminal OT2 and the relay terminal RT2 due to external stress can be prevented to enable reduction in generation of defective products caused by deformation of the relay terminal RT2 after shipping of the products. This effect is conspicuous in particular when the relay terminal RT2 is configured with a press-fit terminal.

While the example of use of the core block 100A has been described in FIG. 19 and FIG. 20, sealing the case 36 with the resin RS is also effective when the core block 100 of the first preferred embodiment as described with reference to FIG. 8 is used.

<Modification 2>

Figure 21:
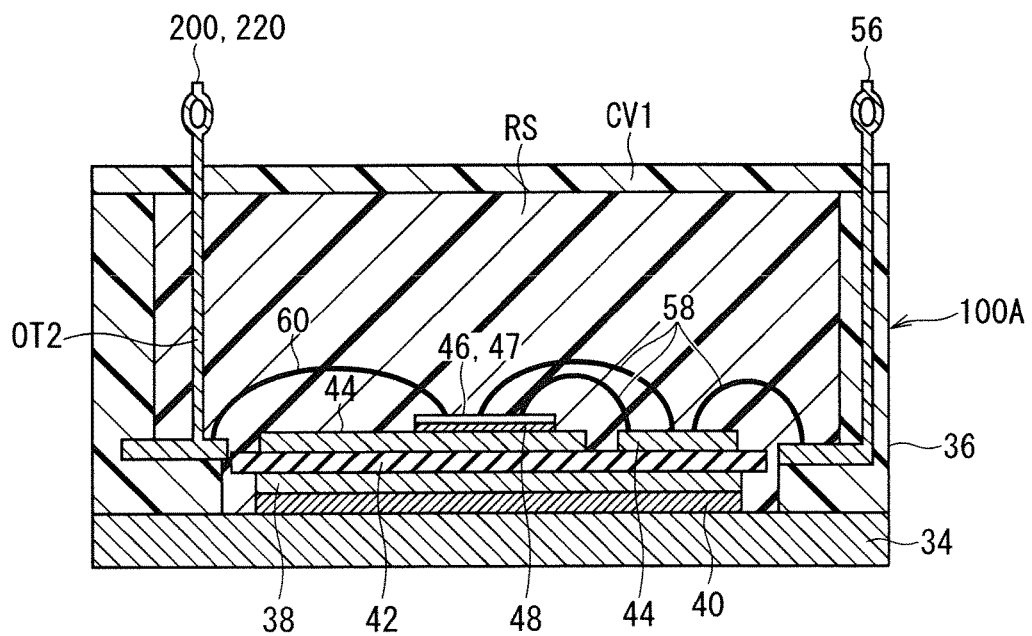
FIG. 21 is a sectional view showing a configuration in which the case is filled with a resin material and an opening portion of the case is covered with a lid.

FIG. 21 discloses a configuration in which a case 36 is filled with a resin material and an opening portion of the case 36 is covered with a lid CV1 in a case where an IGBT module or a MOS transistor module is configured using a core block 100A.

As shown in FIG. 21, an external connection terminal OT2 extending through the resin RS to protrude from the case 36 and a main electrode terminal 56 externally protruding from an end surface of a wall surface of the case 36 externally protrude from an upper surface of the lid CV1 via a through hole (not shown) provided in the lid CV1.

Figure 22:
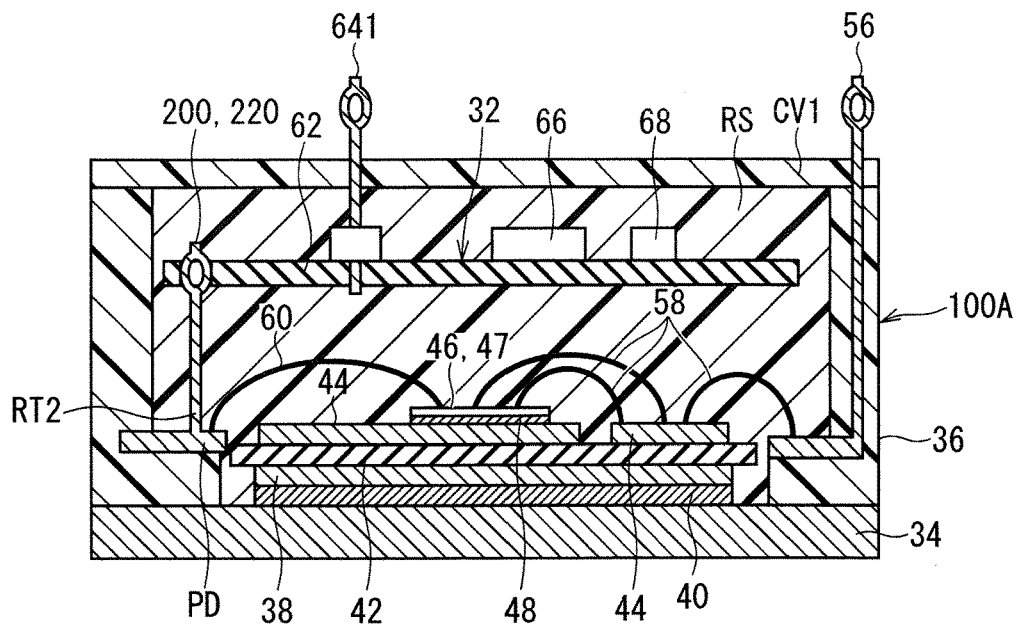
FIG. 22 is a sectional view showing a configuration in which the case is filled with a resin material and the opening portion of the case is covered with the lid.

FIG. 22 discloses a configuration in which the case 36 is filled with a resin material and also the opening portion of the case 36 is covered with the lid CV1 in a case where the IPM is configured using the core block 100A.

As shown in FIG. 22, an external input/output terminal 64 extending through the resin RS to protrude from the case 36 and a main electrode terminal 56 externally protruding from the end surface of the wall surface of the case 36 externally protrude from an upper surface of the lid CV1 via the through hole (not shown) provided in the lid CV1 made of resin.

It is here configured such that the lid CV1 is provided so as to cover the opening portion of the case 36 before filling the case 36 with a resin material, and the resin material is introduced from a resin introduction hole (not shown) provided in the lid CV1. As a result, with the external connection terminal OT2 and the external input/output terminal 64 inserted in the through holes (not shown) provided in the lid CV1, the resin material is introduced, thereby making it possible to prevent deformation of the external connection terminal OT2 and the external input/output terminal 64 due to external stress caused at the time of the introduction of the resin material.

Although FIG. 21 shows a configuration in which the external connection terminal OT2 and the main electrode terminal 56 extend through the lid CV1, in this case, positions of the external connection terminal OT2 and the main electrode terminal 56 are defined by the configuration of the core block 100A.

Figure 23:
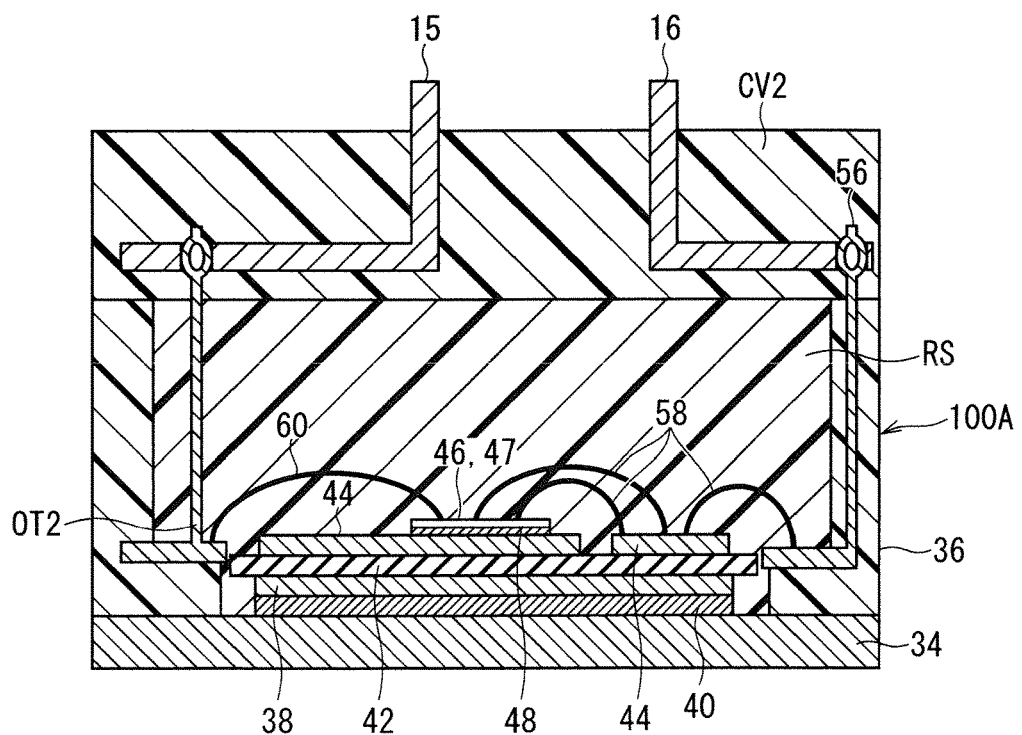
FIG. 23 is a sectional view showing a configuration of the lid which covers the opening portion of the case.

However, positions of the external connection terminal OT2 and the main electrode terminal 56 can be substantially arbitrarily set by making a constitution like that in a lid CV2 shown in FIG. 23 such that with a control terminal 15 and an electrode terminal 16 internally contained, the external connection terminal OT2 is connected to one end of the control terminal 15 and the other end of the control terminal 15 protrudes from an arbitrary position on an upper surface of the lid CV2, and the main electrode terminal 56 is connected to one end of the electrode terminal 16 and the other end of the control terminal 15 protrudes from an arbitrary position on the upper surface of the lid CV2.

In this case, it is assumed that the external connection terminal OT2 and the main electrode terminal 56 are each configured with a press-fit terminal and one end of each of the control terminal 15 and the electrode terminal 16 is provided with a through hole through which the press-fit terminal is inserted.

Here, a configuration of a press-fit terminal will be described with reference to FIG. 24, with the external connection terminal OT2 as an example. As shown in FIG. 24, the press-fit terminal has a needle eye shape so as to make a front end of a press-fit portion PF have spring characteristic, and insertion of the terminal into a through hole TH narrower than the press-fit portion PF enables contact to be kept with an inner wall of the through hole TH.

Additionally, the through hole TH provided in the control terminal 15 is configured such that an inner surface and a periphery thereof are covered with, for example, copper plating to form a plated layer PL1, and further a surface of the plated layer PL1 is covered with, for example, tin plating to form a plated layer PL2, thereby reducing an electric resistance with the press-fit portion PF.

The present invention allows the respective preferred embodiments to be freely combined or appropriately modified or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a power device;
a sensor which measures a physical state of said power device to transmit a signal according to said physical state;
a main electrode terminal through which a main current of said power device flows;
a sensor signal terminal connected to said sensor for receiving a signal from said sensor;
a driving terminal which receives driving power for driving said power device; and
an open bottomed case which houses said power device, said sensor, said main electrode terminal, said sensor signal terminal and said driving terminal,
wherein said sensor signal terminal and said driving terminal each have a first terminal and a second terminal which are not embedded within said case, and said first and second terminals each extend in a same direction from a bottom portion of said case toward an opening portion of said case, an end portion on a bottom portion side of each of said first and second terminals is connected to a terminal pad in common and electrically conducted to each other to form a double structure, and a portion of each of said first and second terminals extending from an upper surface of said terminal pad to an end portion on a side of said opening portion of said case is not in contact with said case.

2. The semiconductor device according to claim 1, wherein
said first terminal has a length that allows a front end portion thereof to externally protrude from an upper surface of said case and inputs/outputs said signal and said driving power to/from the outside, and
said second terminal has a length that fails to allow a front end portion thereof to externally protrude from the upper surface of said case.

3. The semiconductor device according to claim 1, further comprising a control substrate provided at the top of said power device in said case for controlling drive of said power device,
wherein said first terminal and said second terminal each have a length that fails to allow a front end portion thereof to externally protrude from an upper surface of said case, and
said second terminal has a length that allows the front end portion thereof to be connected to said control substrate and inputs/outputs said signal and said driving power to/from said control substrate.

4. The semiconductor device according to claim 1, wherein said case is filled with resin.

5. The semiconductor device according to claim 2, wherein
said case is filled with resin and further includes a lid provided so as to cover the upper surface of said case, and
said first terminal extends through said lid to externally protrude from the upper surface of said lid.

6. The semiconductor device according to claim 3, wherein
said control substrate has an external input/output terminal with a length that allows a front end portion thereof to externally protrude from the upper surface of said case,
said case is filled with resin and further includes a lid provided so as to cover the upper surface of said case, and
said external input/output terminal extends through said lid to externally protrude from the upper surface of said lid.

7. The semiconductor device according to claim 2, wherein
said case is filled with resin and further includes a lid provided so as to cover the upper surface of said case,
said main electrode terminal has a length that allows a front end portion thereof to externally protrude from the upper surface of said case,
said lid contains a control terminal and an electrode terminal,
one end of said control terminal is connected to said first terminal and the other end of said control terminal externally protrudes from the upper surface of said lid,
one end of said electrode terminal is connected to said main electrode terminal and the other end of said electrode terminal externally protrudes from the upper surface of said lid, and
said main electrode terminal and said first terminal include a press-fit terminal.

* * * * *